(12) United States Patent
Guha et al.

(10) Patent No.: US 8,490,619 B2
(45) Date of Patent: Jul. 23, 2013

(54) SOLAR ENERGY ALIGNMENT AND COLLECTION SYSTEM

(75) Inventors: Supratik Guha, Yorktown Heights, NY (US); Yves C. Martin, Yorktown Heights, NY (US); Robert L. Sandstrom, Yorktown Heights, NY (US); Theodore G. van Kessel, Millbrook, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/622,472

(22) Filed: Nov. 20, 2009

(65) Prior Publication Data
US 2010/0218758 A1    Sep. 2, 2010

(51) Int. Cl.
| | |
|---|---|
| *F24J 2/38* | (2006.01) |
| *F24J 2/06* | (2006.01) |
| *G01S 3/784* | (2006.01) |
| *G01S 3/78* | (2006.01) |
| *G05D 3/00* | (2006.01) |

(52) U.S. Cl.
USPC ............ 126/601; 126/572; 126/573; 126/593; 126/600; 250/203.4

(58) Field of Classification Search
USPC .................. 126/601, 572, 573, 574, 578, 593, 126/600; 250/203.4
IPC . F24J 2/38,2/06; G01S 3/78, 3/784; G05D 3/00
See application file for complete search history.

(56) References Cited

U.S. PATENT DOCUMENTS

| | | | | |
|---|---|---|---|---|
| 2,604,601 A | * | 7/1952 | Menzel | 313/531 |
| 3,070,699 A | * | 12/1962 | Lehmann et al. | 250/206 |
| 3,293,440 A | * | 12/1966 | Mueller | 257/459 |
| 3,370,293 A | * | 2/1968 | Green | 342/432 |
| 3,984,685 A | * | 10/1976 | Fletcher et al. | 250/339.11 |
| 3,984,686 A | * | 10/1976 | Fletcher et al. | 250/339.14 |

(Continued)

FOREIGN PATENT DOCUMENTS

| | | |
|---|---|---|
| DE | 2749992 A1 | 5/1979 |
| DE | 4116894 A1 * | 11/1992 |

(Continued)

OTHER PUBLICATIONS

Merriam Webster's Collegiate Dictionary, 10th ed., 1997, p. 451.*

(Continued)

*Primary Examiner* — Steven B McAllister
*Assistant Examiner* — Daniel E Namay
(74) *Attorney, Agent, or Firm* — Cantor Colburn LLP; Vazken Alexanian

(57) ABSTRACT

A solar energy alignment and collection system includes at least two solar energy receivers having a central focal point, with each of the at least two solar energy receivers generating an energy output. An actuation system is operatively coupled to the at least two solar energy receivers and is configured and disposed to shift the solar energy receivers along at least one axis. A control system, operatively linked to the solar receivers and the actuation system, senses the energy output of each solar energy receiver and shifts the actuation system along the at least one axis causing solar energy to be directed at the central focal point. When solar energy is directed at the central focal point, the energy output of each solar energy receiver is substantially identical.

11 Claims, 4 Drawing Sheets

U.S. PATENT DOCUMENTS

| | | | |
|---|---|---|---|
| 4,045,246 A | 8/1977 | Mlavsky et al. | |
| 4,081,289 A | 3/1978 | Campbell, III | |
| 4,086,485 A | 4/1978 | Kaplow et al. | |
| 4,107,521 A * | 8/1978 | Winders | 250/203.4 |
| 4,146,785 A * | 3/1979 | Neale | 250/203.4 |
| 4,200,472 A | 4/1980 | Chappell et al. | |
| 4,223,214 A | 9/1980 | Dorian et al. | |
| 4,225,781 A * | 9/1980 | Hammons | 250/203.4 |
| 4,262,195 A * | 4/1981 | White et al. | 250/203.4 |
| 4,278,829 A | 7/1981 | Powell | |
| 4,586,488 A * | 5/1986 | Noto | 126/578 |
| 4,687,923 A | 8/1987 | Bauck | |
| 4,691,075 A | 9/1987 | Murphy | |
| 4,730,602 A * | 3/1988 | Posnansky et al. | 126/605 |
| 4,868,379 A * | 9/1989 | West | 250/203.4 |
| 5,153,778 A | 10/1992 | Sasian-Alvarado | |
| 5,483,060 A * | 1/1996 | Sugiura et al. | 250/237 R |
| 5,498,297 A | 3/1996 | O'Neill et al. | |
| 5,593,544 A | 1/1997 | Fahlgren et al. | |
| 5,593,549 A | 1/1997 | Stirbl et al. | |
| 6,018,122 A * | 1/2000 | Hibino et al. | 136/246 |
| 6,034,319 A | 3/2000 | Falbel | |
| 6,127,620 A | 10/2000 | Tange et al. | |
| 6,337,129 B1 | 1/2002 | Watanabe et al. | |
| 6,399,874 B1 | 6/2002 | Olah | |
| 6,465,725 B1 * | 10/2002 | Shibata et al. | 136/246 |
| 6,583,349 B2 | 6/2003 | Tanaka | |
| 6,617,506 B2 * | 9/2003 | Sasaki | 136/246 |
| 6,686,533 B2 * | 2/2004 | Baum et al. | 136/244 |
| 6,689,949 B2 | 2/2004 | Ortabasi | |
| 6,696,637 B2 | 2/2004 | Lawheed | |
| 6,897,423 B2 * | 5/2005 | Redler et al. | 250/203.4 |
| 6,992,276 B2 * | 1/2006 | Blauvelt et al. | 250/214.1 |
| 7,109,461 B2 * | 9/2006 | Lasich | 250/203.4 |
| 7,148,465 B2 * | 12/2006 | Blauvelt et al. | 250/214.1 |
| 7,177,140 B2 * | 2/2007 | Clarke et al. | 361/521 |
| 7,202,457 B2 * | 4/2007 | Janus et al. | 250/203.4 |
| 7,208,674 B2 * | 4/2007 | Aylaian | 136/251 |
| 7,476,832 B2 * | 1/2009 | Vendig et al. | 250/203.4 |
| 7,847,228 B2 * | 12/2010 | Lin | 250/203.4 |
| 8,119,962 B2 * | 2/2012 | Lam | 250/203.4 |
| 8,129,668 B2 * | 3/2012 | Chang et al. | 250/203.4 |
| 8,153,944 B2 * | 4/2012 | Hines et al. | 250/203.4 |
| 8,178,775 B2 * | 5/2012 | Taylor et al. | 136/246 |
| 8,188,413 B2 * | 5/2012 | Kats et al. | 250/203.4 |
| 8,188,414 B2 * | 5/2012 | Linke | 250/203.4 |
| 8,188,415 B2 * | 5/2012 | Kats et al. | 250/203.4 |
| 2001/0006066 A1 | 7/2001 | Cherney et al. | |
| 2004/0011395 A1 | 1/2004 | Nicolette et al. | |
| 2004/0216777 A1 * | 11/2004 | Pan | 136/246 |
| 2005/0103378 A1 * | 5/2005 | Pu et al. | 136/291 |
| 2005/0161581 A1 * | 7/2005 | Michiyama et al. | 250/203.4 |
| 2006/0041345 A1 * | 2/2006 | Metcalf | 701/33 |
| 2006/0090747 A1 * | 5/2006 | Harrington | 126/634 |
| 2006/0225778 A1 | 10/2006 | Brabec et al. | |
| 2007/0033828 A1 * | 2/2007 | Hartkop et al. | 34/443 |
| 2007/0051360 A1 * | 3/2007 | Rhee | 126/574 |
| 2007/0144574 A1 | 6/2007 | Yada | |
| 2007/0215199 A1 | 9/2007 | Dold et al. | |
| 2008/0017784 A1 * | 1/2008 | Hoot et al. | 250/203.4 |
| 2008/0087274 A1 * | 4/2008 | Chen | 126/600 |
| 2008/0128586 A1 * | 6/2008 | Johnson et al. | 250/203.4 |
| 2008/0138634 A1 | 6/2008 | Morris et al. | |
| 2008/0164135 A1 * | 7/2008 | Slook | 202/83 |
| 2008/0172256 A1 | 7/2008 | Yekutiely | |
| 2008/0276929 A1 * | 11/2008 | Gerwing et al. | 126/634 |
| 2008/0283121 A1 * | 11/2008 | Guerra | 136/259 |
| 2008/0308152 A1 | 12/2008 | Grip | |
| 2008/0314438 A1 | 12/2008 | Tran et al. | |
| 2009/0043253 A1 * | 2/2009 | Podaima | 604/67 |
| 2009/0084435 A1 | 4/2009 | Guha et al. | |
| 2009/0095342 A1 * | 4/2009 | Lin et al. | 136/251 |
| 2009/0188488 A1 * | 7/2009 | Kraft et al. | 126/601 |
| 2009/0199846 A1 * | 8/2009 | Collins et al. | 126/601 |
| 2009/0229794 A1 | 9/2009 | Schon | |
| 2009/0308377 A1 | 12/2009 | Kleinwaechter | |
| 2010/0000518 A1 * | 1/2010 | Chen et al. | 126/601 |
| 2010/0023138 A1 * | 1/2010 | McDonald et al. | 700/59 |
| 2010/0031991 A1 | 2/2010 | Mochizuki et al. | |
| 2010/0095955 A1 * | 4/2010 | Carrasco Martinez | 126/601 |
| 2010/0101560 A1 * | 4/2010 | Olsson et al. | 126/601 |
| 2010/0180886 A1 * | 7/2010 | Chang | 126/601 |
| 2010/0192940 A1 * | 8/2010 | Yoon | 126/573 |
| 2010/0326427 A1 * | 12/2010 | Chen | 126/601 |

FOREIGN PATENT DOCUMENTS

| | | | |
|---|---|---|---|
| DE | 19801213 A1 * | 7/1999 | |
| EP | 405678 A1 * | 1/1991 | |
| EP | 2105683 A1 * | 9/2009 | |
| JP | 58018059 A * | 2/1983 | |
| JP | 02291912 A * | 12/1990 | |
| JP | 3-256580 A | 11/1991 | |
| JP | 05052702 A * | 3/1993 | |
| JP | 08095641 A * | 4/1996 | |
| WO | 2008034423 A2 | 3/2008 | |

OTHER PUBLICATIONS

Merriam Webster's Collegiate Dictionary, 10th ed., 1997, p. 1250.*
Chia-Yen Lee et al., "Sun Tracking Systems: A Review," Sensors 2009, 9, 3875-3890.
International Search Report; International Application No. PCT/US2011/020654; International Filing Date: Jan. 10, 2011; Date of Mailing: Mar. 9, 2011.
International Search Report—Written Opinion; International Application No. PCT/US2011/020654; International Filing Date: Jan. 10, 2011; Date of Mailing: Mar. 9, 2011.
International Preliminary Report on Patentability for PCT Application No. PCT/US2011/020654, dated Jul. 26, 2012, pp. 1-7.

* cited by examiner

SOLAR ENERGY ALIGNMENT AND COLLECTION SYSTEM

BACKGROUND

The present invention relates to solar concentrator systems and, more particularly, to an alignment and collection system for a solar concentrator system.

Solar power systems fall generally into two categories: fixed position flat panel systems, and tracking solar collection systems. Fixed position flat panel systems employ one or more stationary panels that are arranged in an area having an unobstructed view of the sun. As the earth rotates, the sun's rays move over the stationary panel(s) with varying degrees of intensity depending upon geographic location, the time of day and the time of the year. In contrast, tracking solar collection systems collect, and focus the sun's rays onto one or more solar panels. Tracking solar collectors employ a tracking system that follows the sun's path in order to enhance energy collection. Simply put, fixed position flat panels represent a passive solar collection system, while tracking solar concentrator systems represent a more active energy collection system.

Tracking systems for solar collectors take on a variety of forms, from complex computer and satellite (GPS) tracking to the use of photodiodes. GPS tracking relies on determining a particular location on the ground, and correlating that location to the location of the sun at a given, known, time of day. More conventional systems utilize an auxiliary alignment sensor that employs photodiodes. The photodiodes rely on differential sensing parameters to track the sun. That is, one or more photodiode cells are exposed to the sun's rays. The sun's rays impinge upon the photodiodes and a controller determines how much, for example, voltage is produced by each photodiode cell. The controller then orients the plurality of photodiode cells until voltage from each cell is substantially similar. At this point, an offset is calculated and a solar collector is oriented to a desired orientation. The offset represents a distance between a solar collector and the photodiodes. The need to calculate an offset increases tracking complexity and reduces collection efficiency.

SUMMARY

According to one embodiment of the present invention, a solar concentration system includes at least two solar energy receivers having a central focal point, with each of the at least two solar energy receivers generating an energy output based on received light energy. An actuation system is operatively coupled to the at least two solar energy receivers. The actuation system is configured and disposed to shift the at least two solar energy receivers along at least one axis. A control system is operatively linked to the at least two solar receivers and the actuation system. The control system senses the energy output of each of the at least two solar energy receivers and shifts the actuation system along the at least one axis causing solar energy to be directed at the central focal point. When the solar energy is directed at the central focal point, the energy output of each of the at least two solar energy receivers is substantially identical.

A method and system for aligning solar receivers with the sun is also described and claimed herein.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
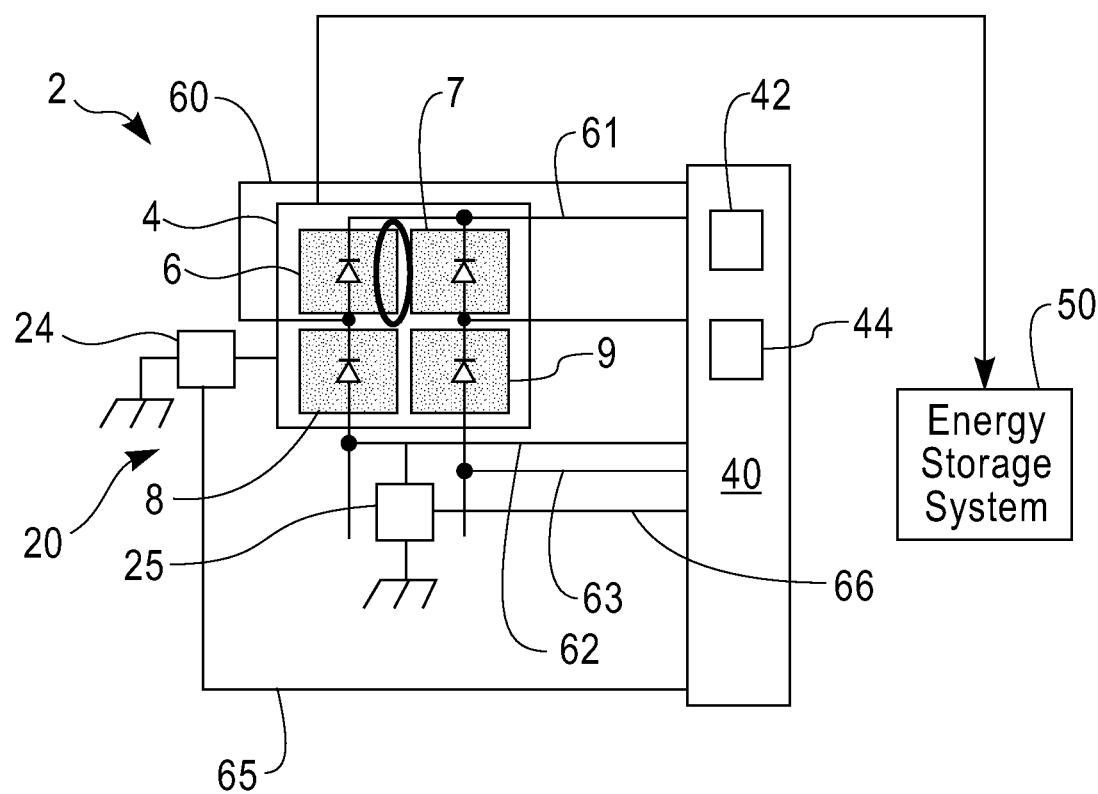
FIG. 1 is a schematic diagram of a solar energy alignment and collection system including a plurality of solar receivers having a central focal point in accordance with an exemplary embodiment, illustrating with solar energy impinging upon the solar receivers at a position spaced from the focal point.

With reference now to FIG. 1, a solar energy alignment and concentration system constructed in accordance with an exemplary embodiment is indicated generally at 2. Solar energy alignment and collection system 2 includes a base member 4, upon which are mounted a plurality of solar energy receivers 6-9 arranged in an array. In accordance with an exemplary embodiment, solar energy alignment and collection system 2 includes four (4) solar energy receivers, however the number of receivers could vary without departing from the scope of the invention. In further accordance with an exemplary embodiment, solar receivers 6-9 take the form of triple junction solar cells, such as photovoltaic cells, arranged in a quadrant pattern. Solar energy alignment and collection system 2 further includes an actuation system 20 having first and second actuators 24 and 25 operatively coupled to the array of solar receivers 6-9. First and second actuators 24 and 25 take the form of electro-mechanical systems configured to shift each actuator 24, 25 along corresponding ones of first and second perpendicular axes. Of course it should be understood that actuators 24 and 25 could take on a variety of forms such as electric motor and gear assemblies, hydraulic actuators, solenoids, and/or piezo-electric elements. Further shown in FIG. 1, solar energy alignment and collection system 2 includes an alignment controller 40 having an analog-to-digital (A-D) converter 42 that operates as a computer, and a digital-to-analog (D-A) converter 44. Finally, solar energy alignment and collection system 2 includes an energy storage system 50 which, as will be discussed more fully below, receives and stores electrical energy that is converted from light energy received by solar energy receivers 6-9.

Alignment controller 40 is operatively connected to each of the plurality of solar receivers 6-9 via signal lines 60-63 respectively. Alignment controller 40 is also electrically coupled to each actuator 24, 25 via corresponding control lines 65 and 66. With this arrangement, controller 40 determines an optimum position of solar receivers 6-9 relative to the sun to ensure optimal alignment of solar energy alignment and collection system 2. More specifically, alignment controller 40 ensures that radiation intensity from the sun focuses on a centroid of the array of solar receivers 6-9. Towards that end, alignment controller 40 monitors energy output from each of solar receiver 6-9.

Figure 2:
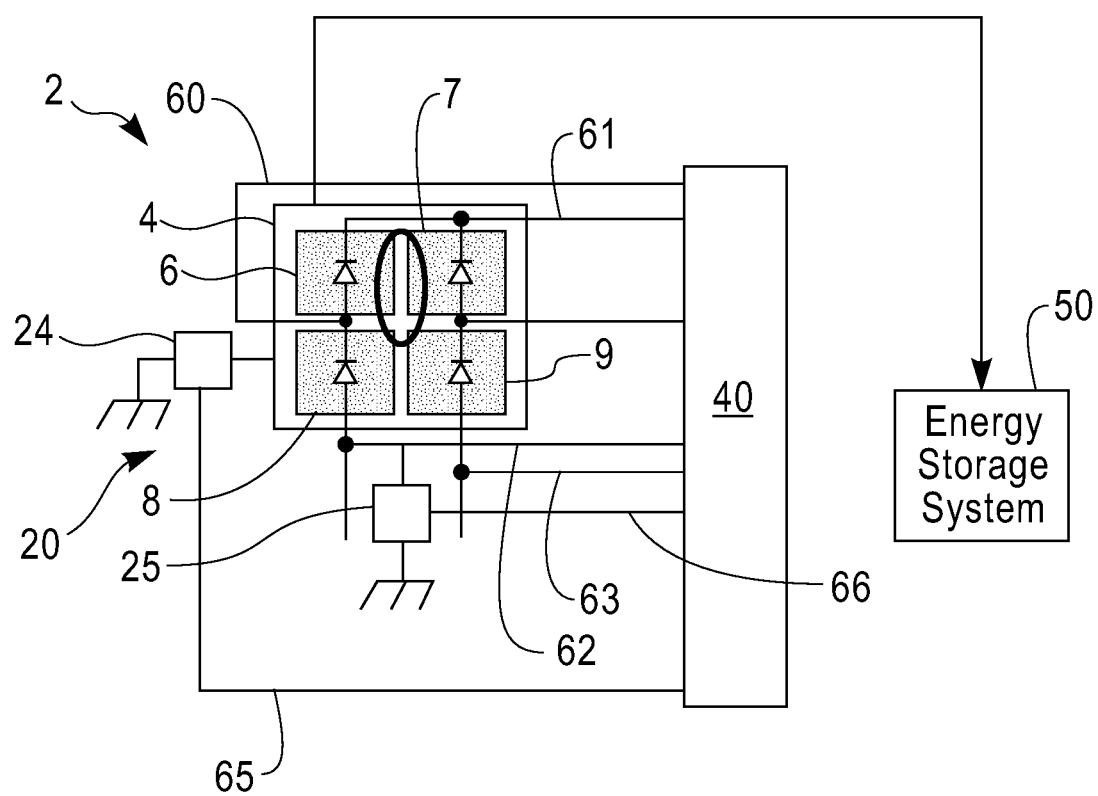
FIG. 2 is a schematic diagram of the solar energy alignment and collection system in accordance with an exemplary embodiment illustrating the solar alignment system shifting the solar receivers to position the solar energy at a focal point of the solar receivers.
Figure 3:
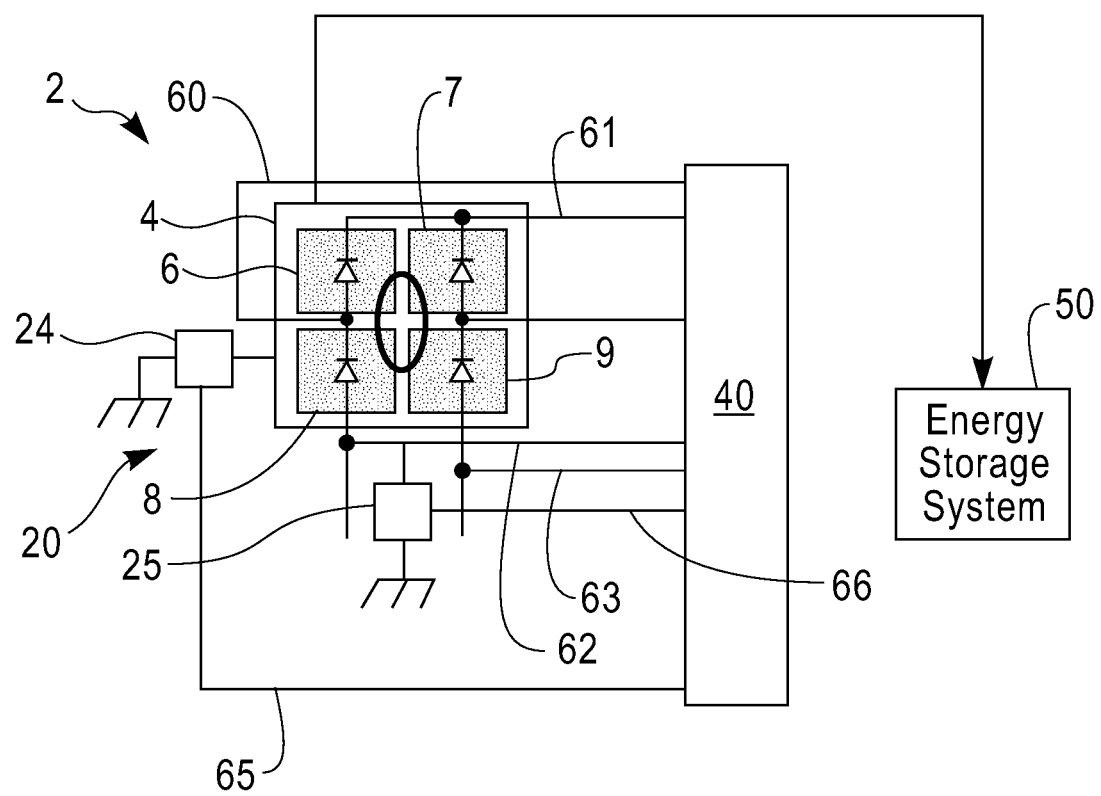
FIG. 3 is a schematic diagram of the solar energy alignment and collection system in accordance with an exemplary embodiment illustrating the solar receivers shifted to a position that aligns the solar energy at the focal point.

The energy output from each solar receiver is evaluated to determine whether any one of the plurality of solar receivers 6-9 is outputting more energy than others of the solar receivers 6-9. In accordance with one aspect of an exemplary embodiment, a current sensing device employing a Hall effect sensor is employed to provide an electrically isolated voltage output that is proportional to current flow. The Hall effect sensor has a very low resistance and, as such, does not interfere with the current flow from solar receivers 6-9. That is, in the event that solar energy is focused on, for example, solar receiver 6 such as shown in FIG. 1, energy output from solar receiver 6 will be higher than the energy output from solar receivers 7-9. Alignment controller 40 evaluates the deviation of the energy output from each cell and then selectively activates actuator 24 and/or 25 to shift the array of solar receivers 6-9 and re-align the solar radiation intensity with the centroid to achieve a balanced energy output. In order to start balancing energy output, alignment controller 40 activates actuators 24 and 25 to shift base member 4 along corresponding first and second axes to centralize the solar energy impinging upon solar receivers 6-9 such as shown in FIG. 2. As base member 4 transitions, alignment controller 40 continues to monitor the energy output from each solar receiver 6-9. Alignment controller 40 continues to determine and compare the energy output from each solar receiver 6-9 until the solar energy focuses on a centroid (not separately labeled) of solar receivers 6-9 such as shown in FIG. 3. When the solar energy focuses on the centroid of solar receivers 6-9, energy output from each solar receiver 6-9 is substantially identical. A portion of the energy output may be stored to aid in powering a tracking system when solar receivers 6-9 are not fully positioned and producing power. Exemplary storage devices could include batteries and flywheel storage devices.

With this arrangement, the exemplary embodiments provide a system that accurately aligns solar receiving cells with solar energy from the sun in order to enhance energy production. In particular, when employing concentrated solar energy collection systems, precise alignment of the solar energy collectors with the solar rays enhances energy collection. Moreover, by combining solar energy tracking or alignment features with the same solar cells/receivers used for energy production, there is no need for an auxiliary sensor to compute alignment. In this manner, exemplary embodiments reduce overall system cost and eliminate the need to calculate offsets or other factors that contribute to alignment error.

Figure 4:
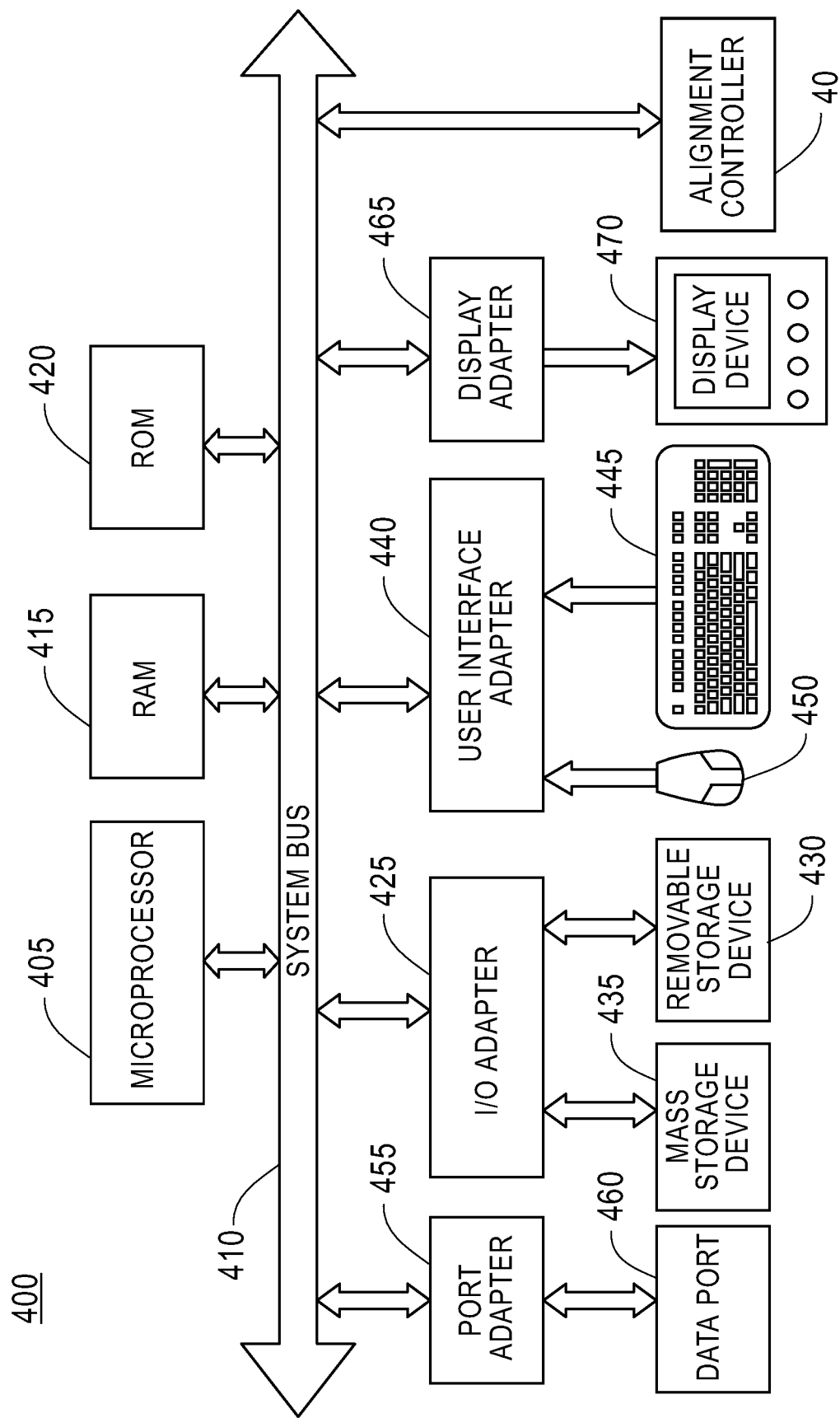
FIG. 4 is a block diagram of a general-purpose computer linked to a solar concentrator alignment system in accordance with an exemplary embodiment.

The method of aligning solar energy receivers with the sun described herein can also be practiced with a general-purpose computer such as illustrated at 400 in FIG. 4 and the method may be coded as a set of instructions on removable or hard media for use by the general-purpose computer 400. In FIG. 4, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for connecting a removable data and/or program storage device 430, a mass data and/or program storage device 435, a user interface adapter 440 for connecting a keyboard 445 and a mouse 450, a port adapter 455 for connecting a data port 460, a display adapter 465 for connecting a display device 470, and alignment system 40 that is configured and disposed to shift first and second actuators to align solar receivers 6-9 with solar rays from the sun.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While preferred embodiments have been described, it will be understood that those skilled in the art, both now and in the future, may make various improvements and enhancements which fall within the scope of the claims which follow. These claims should be construed to maintain the proper protection for the invention first described.

What is claimed is:

1. A solar energy alignment and concentration system comprising:
at least two solar energy receivers having a centroid, each of the at least two solar energy receivers being configured and disposed to receive a concentrated solar energy input and generate an energy output based on received light energy;
an actuation system operatively coupled to the at least two solar energy receivers, the actuation system being configured and disposed to shift the at least two solar energy receivers along at least one axis;
a control system operatively linked to the at least two solar energy receivers and the actuation system, the control system sensing the energy output of each of the at least two solar energy receivers and shifting the actuation system along the at least one axis causing solar energy to be directed at the centroid wherein, when the solar energy is directed at the centroid, the energy output of each of the at least two solar energy receivers is substantially identical to enhance energy production of the solar energy and concentration system; and an energy storage system operatively coupled to the at least two solar energy receivers, the energy storage system receiving and storing the energy output from each of the at least two solar energy receivers.

2. The solar energy alignment and concentration system according to claim 1, wherein the actuating system includes a first actuator and a second actuator, the first actuator being configured and disposed to shift the at least two solar energy receivers along a first axis and the second actuator being configured and disposed to shift the at least two solar energy receivers along a second axis, the first axis being substantially perpendicular relative to the second axis.

3. The solar energy alignment and concentration system according to claim 2, wherein each of the first and second actuators includes an electro-mechanical solenoid.

4. The solar energy alignment and concentration system according to claim 2, wherein at least one of the first and second actuators includes one of an electric motor and gear assembly, a hydraulic actuator and a pneumatic actuator.

5. The solar energy alignment and concentration system according to claim 1, wherein the at least two solar energy receivers includes at least four solar energy receivers.

6. The solar energy alignment and concentration system according to claim 5, wherein the at least four solar energy receivers are arranged in a quadrant pattern.

7. The solar energy alignment and concentration system according to claim 1, wherein each of the at least two solar energy receivers is a photovoltaic solar cell.

8. The solar energy alignment and concentration system according to claim 7, wherein the photovoltaic solar cell is a triple junction solar concentrator cell.

9. The solar energy alignment and concentration system according to claim 1, wherein the controller includes at least one of a digital-to-analog converter and an analog-to-digital converter.

10. A system for aligning a solar concentrator of a solar energy alignment and concentration system with the sun, the system comprising:

a central processing unit (CPU), said CPU being interconnected functionally via a system bus to at least one memory device thereupon stored a set of instructions which, when executed by said CPU, causes said system to:

receive concentrated solar energy on at least two solar energy receivers;

measure an energy output from each of the at least two solar energy receivers;

compare the energy output from one of the at least two solar energy receivers with the energy output from another of the at least two solar energy receivers;

shift the at least two solar energy receivers until the energy output from the one of the at least two solar energy receivers is substantially equal to the another of the at least two solar energy receivers to enhance energy production of the solar energy alignment and concentration system; and storing the concentrated solar energy received by the at least two solar energy receivers.

11. The system according to claim 10, wherein the set of instructions which, when executed by said CPU, causes said system to: shift at least four solar energy receivers arranged in a quadrant pattern having a centroid along first and second axes until the solar energy impinges upon the centroid.

* * * * *